Sept. 13, 1966 A. SOMLYODY 3,272,993
SEMICONDUCTOR GATING CIRCUITS FOR COUNTER EMPLOYING SINGLE SIGNAL SOURCE AND DIODE MATRIX FOR EFFECTING SEQUENCING
Filed Dec. 4, 1963
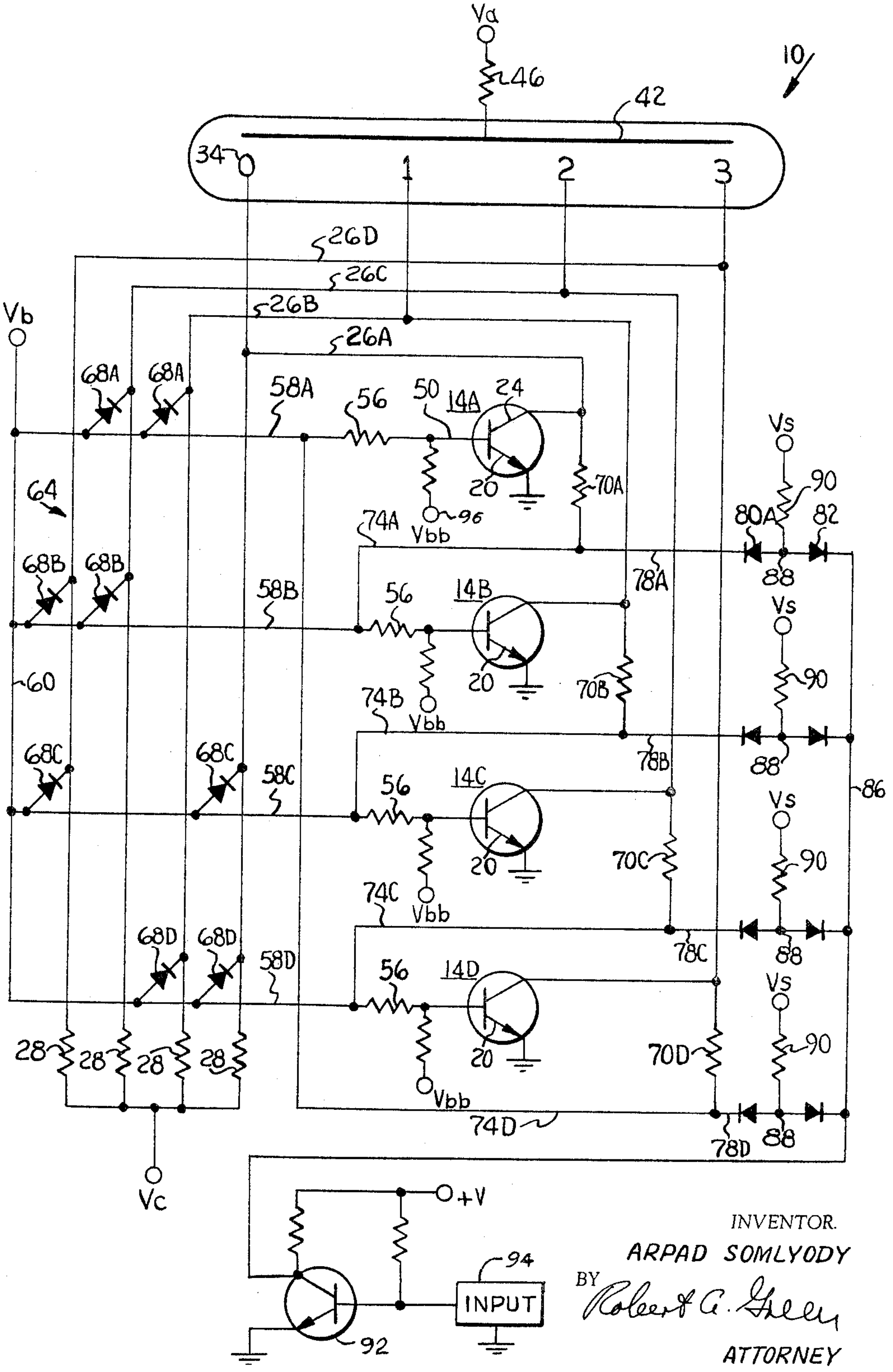
INVENTOR.
ARPAD SOMLYODY
BY Robert A. Green
ATTORNEY United States Patent Office 3,272,993
Patented Sept. 13, 1966

3,272,993
SEMICONDUCTOR GATING CIRCUITS FOR COUNTER EMPLOYING SINGLE SIGNAL SOURCE AND DIODE MATRIX FOR EFFECTING SEQUENCING

Arpad Somlyody, Raritan, N.J., assignor to Burroughs Corporation, Detroit, Mich., a corporation of Michigan
Filed Dec. 4, 1963, Ser. No. 327,986
2 Claims. (Cl. 307—88.5)

My invention relates to electronic circuits and particularly to circuits such as counters, registers, or the like which use a semiconductor device as the counting unit for each step of the counter and which use a diode matrix for interconnecting the semiconductor counting devices.

In the past, I have devised several counting circuits which utilize semiconductor devices as the counting units thereof and interconnected by a diode matrix. The present invention utilizes such a diode matrix. However, this invention provides a novel arrangement for coupling one counting device to the next adjacent device in the counting series and for applying signals for causing the counting operation to proceed from one device to the next. The present invention derives its novelty, in part, from the fact that the counting operation is performed by means of D.C. potentials, and, as a result, no capacitors are required in the circuit.

The objects of the present invention concern the provision of new and improved counting circuits which utilize semiconductor devices as the counting elements thereof and which utilize a diode matrix for interconnecting the counting elements.

Briefly, apparatus embodying the invention includes a plurality of semiconductor devices such as transistors which constitute counting steps in a counter. The counting devices are interrelated through a diode matrix, and the interconnections are such that, as each device registers a count, all of the other devices, except the adjacent device, are prevented from registering a count. Auxiliary means is provided for preventing the adjacent device from registering a count and for causing the count to proceed from one device to the next. This latter means includes a first D.C. current flow path through a counting control discharge device and auxiliary D.C. current flow paths which affect each of the counting devices. The counting control discharge device determines which current flow path is operative and which counting device is operative.

The invention is described in greater detail by reference to the drawing wherein the single figure is a schematic representation of a counter circuit which embodies the principles of the invention.

A counting circuit 10 embodying the invention includes a plurality of counting positions connected together to provide a series of counts. This circuit may include substantially any number of positions. For convenience, only four positions are shown, each including as a counting element a semiconductor device such as a transistor 14 of either PNP or NPN type. The transistors are designated 14A, 14B, 14C, and 14D.

For purposes of illustration, the circuit is described for use with NPN transistors as the counting units or elements thereof. Each transistor 14 includes an emitter electrode 20 which is connected to ground and a collector or output electrode 24 which is connected by a lead 26 (A, B, C, D) through a load resistor 28 to a positive D.C. power supply $Vc$. Each collector 24 is also connected to a suitable utilization device which may be one of the cathode indicator electrodes 34 of a multicathode gaseous indicator device 38 such as a type 6844A tube. Thus, the first transistor 14A is connected to the "0" cathode electrode; the next transistor 14B is connected to the cathode which represents numeral "1," and so forth, in order, along the register positions. The anode 42 of the indicator tube 38 is connected through a resistor 46 to a positive D.C. power source $Va$.

Each transistor 14 also includes a base or input electrode 50 which is connected through a base resistor 56 and lead 58 (A, B, C, D) to a bus 60 which is connected to a positive D.C. power source $Vb$. Each base electrode is also coupled through a bias resistor 62 to a source of negative D.C. potential $Vbb$.

In the circuit 10, the transistors 14 are interrelated through a diode matrix 64 to promote their execution of the counting operation. The connections of the transistors through the diodes 68 of the matrix are as follows. Each collector or output electrode 24 of each transistor 14 is connected through its lead 26 and a diode 68 (A, B, C, D) to the base electrode of every other transistor except the next adjacent leading transistor in the counting series. The diodes are oriented so that their cathodes are connected to collector electrodes and their anodes are connected to base electrodes. Thus, the collector electrode of transistor 14A is connected to the cathode of a diode 68B, the anode of which is connected to the base electrode of the transistor 14B. The collector of transistor 14A is similarly coupled by diodes 68C and 68D to the base electrodes of transistors 14C and 14D. The collector electrode of transistor 14B is coupled in similar fashion through diodes 68A and 68D to all base electrodes except its own. The other collector electrodes are similarly connected.

The circuit 10 also includes novel means in addition to the diode matrix 64 for interconnecting adjacent counting transistors 14 and for causing the series of transistors to execute a counting cycle in the desired sequence from 14A to 14B to 14C to 14D. According to the invention, this means includes the coupling of each collector or output electrode 24 through a coupling resistor 70 (A, B, C, D) and lead 74 (A, B, C, D) to the lead 58 which is connected through the base resistor 56 to the base electrode 50 of the adjacent transistor in the counting chain. In addition, a lead 78 (A, B, C, D) extends from each lead 74 through a pair of diodes 80 and 82 to a count control bus 86. The diodes are oriented with their anodes connected together as shown. The junction 88 of each diode pair is connected through a bias resistor 90 to a source of positive D.C. potential $Vs$.

The count control bus 86 is connected to the output or collector electrode of a count control discharge device 92, for example, a NPN transistor having the usual base, emitter, and collector electrodes and connected to be normally conducting so that its collector electrode is at about ground potential. A source 94 of input count pulses is coupled to the base or input of control device 92.

Means are also provided for setting or resetting the counter at the zero position, for example, at the start of a counting operation or at some time during a counting cycle. This means includes a source 96 of positive pulses coupled to the base electrode of transistor 14A for turning on this transistor.

In operation of the counting circuit of the invention, the count control transistor 92 is arranged and biased to be normally conducting. A set pulse from source 96 is applied to the base electrode of transistor 14A to turn it on. With transistor 14A turned on, its collector electrode 24 is at about ground potential, and this ground potential is coupled through the appropriate diodes 68 and the diode matrix 64 to the base electrodes of all but the adjacent transistor 14B so that the other transistors 14C and 14D are held off. The ground potential of the collector electrode of transistor 14A is also coupled through resistor 70A and lead 74A to the base electrode of transistor 14B which is thus held off. Thus, all but transistor 14A are held off, and only transistor 14A registers a count.

With control transistor 92 on and its collector electrode at about ground potential, the control bus 86 and the cathodes of the diodes 82 are at about ground potential. Thus, these diodes are biased in the forward direction, and current flows from each power source V*s* through the associated diode 82 and bus 86 to ground. Thus, the junction points 88 of the two diodes 80 and 82 are at about ground potential. With the junction points 88 at about ground potential, it can be seen that the cathodes of the diodes 80 coupled to transistors 14B to 14D are at a relatively positive potential because of their connections to the collector electrodes of these transistors which are held off. Thus, these diodes 80 are rather strongly biased in the reverse direction. However, the diode 80A coupled to the collector electrode of transistor 14A has approximately ground potential coupled to both of its electrodes, so that this diode is primed and may be more readily biased in the forward direction than the other diodes 80.

When it is desired to register a count in the circuit 10, the control transistor 92 is turned off by the application of a suitable positive count pulse from source 94, and, as a result, its collector electrode and bus 86 rise to a generally positive potential which biases the diodes 82 in the reverse direction and stops current flow therethrough. At this time, a positive potential from source V*s* is applied to the anode of primed diode 80′ which is thus biased in the forward direction. However, V*s* is not sufficiently positive to forward-bias the other diodes 80. Thus, current flows from source V*s* through diode 80A and through lead 74A to the voltage source V*bb* associated with the base electrode of transistor 14B. The base electrode of transistor 14B is now raised to a sufficiently positive potential so that transistor 14B turns on and registers a count. Now, the collector electrode of transistor 14B is reduced to about ground potential, and this potential, coupled through the diode matrix, holds off all transistors except the adjacent transistor 14C. Transistor 14C is held off by its coupling through lead 74B and resistor 70B to the collector electrode of transistor 14B.

The removal of the count pulse from control transistor 92 is timed so that the control transistor returns to its normal conducting state when the count has transferred from transistor 14A to 14B. When control transistor 92 is turned on, current flows through the diodes 82 and bus 86 once again. The next counting pulse applied from source 94 to the control transistor 92 turns it off and, as described above, the count is switched to, and is registered in, the next transistor 14C. A series of counting pulses may thus be applied to the transistors 14, which execute a counting cycle in response thereto.

What is claimed is:

1. A counting circuit including
a plurality of counting stages, each comprising a counting device having input and output electrodes,
all of said devices being interconnected so that only one device at a time can register a count,
each input electrode being connected through a first diode and a resistive path to a voltage source and through said first diode and a second diode to a common signal input line,
a source of counting pulses comprising a pulse generating semiconductor device having input and output electrodes,
the output of said pulse generating semiconductor device being connected to said signal input line and thus through said first and second diodes to the input electrode of each of said counting devices,
said pulse generating semiconductor device being normally on and being turned off to generate an input counting pulse on said signal input line,
said pulse generating semiconductor device being normally on so that current flows from said voltage source through all of said second diodes to ground, said current flow serving to block all of said first diodes except the first diode positioned between a counting device which is on and the next adjacent counting device which is off, this excepted first diode being in a primed state so that, when said pulse generating semiconductor device is turned off and generates an input count pulse, only the excepted first diode can pass the count pulse and only the next adjacent device can be turned on thereby to register a count.

2. A counting circuit including
a plurality of semiconductor counting devices connected in a chain to form a series of counting steps,
each device including an input and output electrode,
the output electrode of each counting device being coupled through a separate diode to the input electrode of every other device except the next adjacent device in the counting chain, whereby, as each device is turned on and registers a count, the potential which appears on its output electrode is applied to and prevents all devices but the next adjacent device from registering a count,
the output electrode of each device also being coupled through a first resistive path to the input electrode of the next adjacent device in the counting chain so that, as each device is turned on and registers a count, the potential which appears on its output electrode is coupled to the input electrode of the next adjacent device in the counting chain whereby, as each device turns on, it holds off the next adjacent device,
a source of bias potential coupled through a separate second resistive path and a first diode to said first resistive path and through a second diode to a signal input line,
a source of counting pulses comprising a pulse generating semiconductor device having input and output electrodes,
the output of said pulse generating semiconductor device being connected to said signal input line and through said first and second diodes to the input electrode of each of said counting devices,
said pulse generating semiconductor device being normally on and being turned off to generate an input counting pulse on said signal input line,
said pulse generating semiconductor device being normally on so that current flows from said bias source through all of said second diodes to ground, said current flow serving to block all of said first diodes except the first diode positioned between a counting device which is on and the next adjacent counting device which is off, this excepted first diode being in a primed state so that, when said pulse generating semiconductor device is turned off and generates an input count pulse, only the excepted first diode can pass the count pulse and only the next adjacent device can be turned on thereby to register a count.

References Cited by the Examiner

UNITED STATES PATENTS

| | | | |
|---|---|---|---|
| 2,912,578 | 11/1959 | Van Duuren et al. | |
| 3,005,917 | 10/1961 | Hufmann | 328—49 X |
| 3,210,569 | 10/1965 | Reek | 328—49 X |

ARTHUR GAUSS, *Primary Examiner.*

J. HEYMAN, *Assistant Examiner.*